United States Patent [19]

Erickson

[11] 4,381,487
[45] Apr. 26, 1983

[54] RESONATOR COUPLED DIFFERENTIAL AMPLIFIER

[75] Inventor: Bert K. Erickson, Fayetteville, N.Y.

[73] Assignee: General Electric Company, New York, N.Y.

[21] Appl. No.: 319,494

[22] Filed: Nov. 9, 1981

Related U.S. Application Data

[63] Continuation of Ser. No. 102,226, Dec. 10, 1979.

[51] Int. Cl.³ .............................................. H03F 3/191
[52] U.S. Cl. .................................. 330/306; 330/174; 330/252; 330/311
[58] Field of Search ................. 330/94, 174, 252, 257, 330/306, 311; 331/116 R, 116 M, 159

[56] References Cited

U.S. PATENT DOCUMENTS

| | | | |
|---|---|---|---|
| 2,510,868 | 6/1950 | Day | 178/44 |
| 2,833,924 | 5/1958 | Tongue | 331/159 |
| 3,916,344 | 10/1975 | Enderly | 331/116 R |
| 3,979,693 | 9/1976 | Saari | 331/116 R X |
| 3,996,530 | 12/1976 | Feister et al. | 331/116 R |
| 4,227,156 | 10/1980 | Mattfeld | 330/174 X |

OTHER PUBLICATIONS

"Ceramic Filter BFU455 Technical Data," Murata Manufacturing Co. Ltd., Jul. 7, 1976.
"MC1596 Balanced Modulator," Application Note AN-531 of Motorola Semiconductor Products, Inc., ©1971.

*Primary Examiner*—James B. Mullins
*Attorney, Agent, or Firm*—Carlos Nieves; John R. Rafter; George R. Powers

[57] ABSTRACT

In differential amplifier circuits of the type having first and second transistors, the emitter of each transistor is connected to a different current source and the emitters are coupled by a ceramic filter tuned to 455 KHz. In one embodiment, wherein the transistors have symmetrical resistive loads, an inductor is connected across the filter to tune out capacitance across the terminals of the filter. In another embodiment, the circuit includes an unbalanced and complex load. In yet another embodiment, the circuit has active load circuitry and an inductor is connected across the filter to tune out capacitance across the terminal of the filter.

8 Claims, 4 Drawing Figures

RESONATOR COUPLED DIFFERENTIAL AMPLIFIER

This application is a continuation, of application Ser. No. 102,226, filed Dec. 10, 1979.

BACKGROUND OF THE INVENTION

1. Field of the Invention

The subject invention generally relates to bandpass amplifier circuits and, in particular, to differential amplifier circuits having bandpass characteristics.

2. Description of Prior Art

Persons skilled in the art to which the invention relates are at least constructively aware of bandpass amplifiers such as disclosed in U.S. Pat. No. 2,510,868, issued to J. R. Day on June 6, 1950. In said amplifiers an emitter follower, having a first triode tube, is coupled by a ceramic crystal to the cathode of a second triode tube. With reference to the second tube, its cathode is coupled to ground by a resistor, its anode is coupled to a power supply by a load resistor and its grid is coupled to ground by a variable grid resistor. In addition, the grid is coupled by a variable capacitor to the output of the emitter follower. The variable capacitor and grid resistor are used to compensate for capacitance associated with a holder for the crystal.

Persons skilled in the art are also aware of solid state bandpass amplifiers. A typical amplifier of this type includes a transistor, a collector or load resistor, and emitter resistor and a voltage divider arrangement of resistors for biasing the transistor in its active region. A ceramic crystal connected in parallel with the emitter resistor gives the amplifier its bandpass characteristic.

The stability of transistor differential amplifier circuits has made them popular with integrated circuit designers and such amplifiers have been used in the IF sections of radios. In typical circuits, the bandwith and center frequency of the amplifiers is controlled with tuned collector circuits. The gain of differential amplifiers has been set, for example, by coupling the emitters of an amplifier with a resistor having a predetermined value.

SUMMARY OF THE INVENTION

It is an object of the present invention to provide a stable bandpass amplifier circuit whose passband is controlled with a resonator, and a substantial part of which ends itself to manufacture as an integrated circuit.

The invention herein may be described broadly as a bandpass amplifier circuit of the type which is responsive to a DC power supply. Structurally, the amplifier includes: (a) a first transistor having a base, a collector, and an emitter; (b) a second transistor having a base, a collector, and an emitter; (c) means adapted for connection to the power supply for coupling a first voltage to the collector of the first transistor; (d) impedance means, adapted for coupling to the power supply, coupled to the collector of the second transistor; (e) means responsive to the power supply and coupled to the bases of the transistors for biasing each of the transistors in their active region; (f) a first current source circuit responsive to the power supply and connected in series with the emitter of the first transistor; (g) a second current source circuit responsive to the power supply and connected in series with the emitter of the second transistor; (h) a series resonator coupling the emitters of the first and second transistors.

Ceramic filters or resonators having a center frequency of 455 Khz±2 KHz and suitable bandwidths are available for use in the invented circuit and, therefore, the circuit may be used as an intermediate frequency stage of a low cost AM radio. Significantly, in such a stage the otherwise usual AM IF alignment steps are unnecessary.

A BRIEF DESCRIPTION OF THE DRAWINGS

The above-mentioned and other objects and features of the invention will become apparent by reference to the following description in conjunction with the accompanying drawing in which.

DESCRIPTION OF PREFERRED EMBODIMENT

Figure 1:
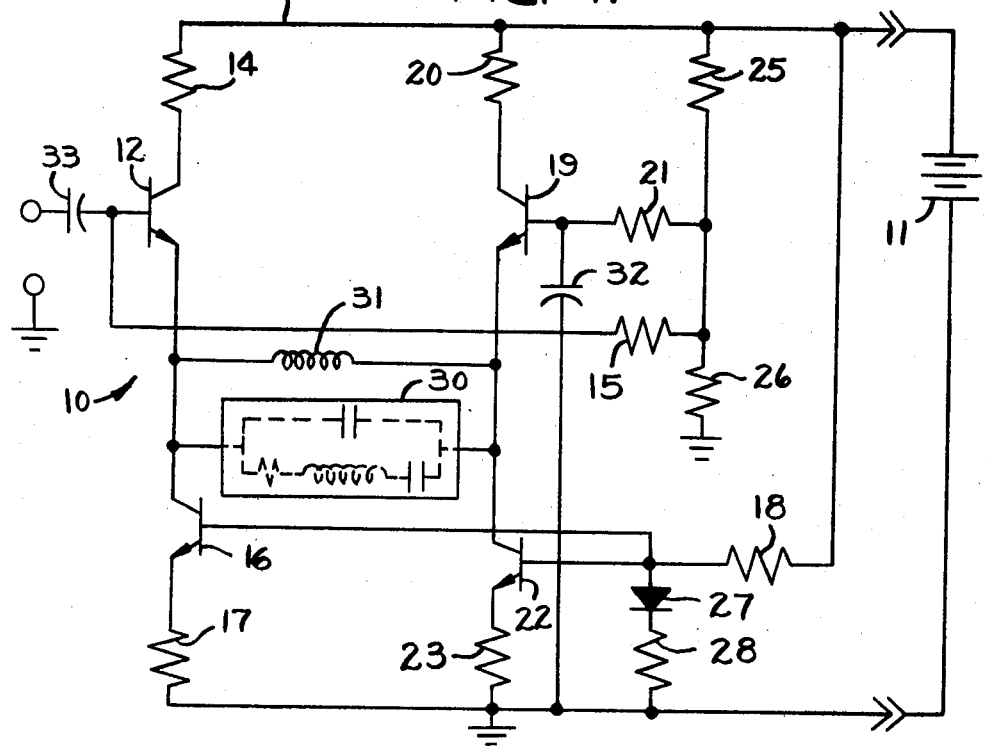
FIG. 1 is a schematic diagram of a bandpass amplifier, according to the invention.

Referring to FIG. 1, a bandpass amplifier circuit 10, according to the invention, is shown connected to a DC power source 11. In the circuit an NPN transistor 12 includes: a collector which is coupled to a power line 13 by a resistor 14, a base which is coupled by a resistor 15 to a voltage divider network and an emitter which is coupled to a current source circuit. The current source circuit includes an NPN transistor 16 having a collector which is connected to the emitter of transistor 12, an emitter which is coupled to ground by a resistor 17, and a base which is coupled by a resistor 18 to the power line 13. In this example, the potential on the power line and the value of resistor 18 substantially determine the current provided by the current source circuit. The circuit also includes an NPN transistor 19 having a collector which is coupled to power line 13 by a resistor 20, a base which is coupled by a resistor 21 to the voltage divider network, and an emitter which is coupled to another current source circuit. The current source circuit includes NPN transistor 22 having a collector which is connected to the emitter of transistor 19, an emitter which is coupled to ground by a resistor 23, and a base which is also coupled by resistor 18 to the power line 13. The value of resistor 18 also determines the current provided by the current circuit. The voltage divider network includes a pair of resistors 25 and 26 which are connected in series between the power line 13 and ground. In addition to being connected to resistor 18, the bases of transistors 16 and 22 are connected to the anode of a diode 27, the cathode of which is coupled to ground by a resistor 28. This arrangement provides temperature stability to the current source circuits. Resistors 15 and 21 are each connected to a point between resistors 25 and 26 and resistors 15, 21, 25 and 26 have values which bias transistors 12 and 19 in their active regions when a predetermined voltage is present on line 13.

In the circuit, the emitters of transistors 12 and 19 are coupled by a ceramic filter 30 which, as the dotted line network indicates, may be viewed as a high Q series resonator, and an inductor 31 intended to be resonant with a capacitance, primarily equal to the value of a capacitance inherently present between the terminals of the filter. The resonant frequency provided by the inductor is usually designed to be equal to the nominal or actual resonant frequency of the ceramic filter but it should be understood that other design frequencies may be called for by modern filter designs, depending upon the desired characteristics of the final filter. The base of transistor 19 is coupled to ground by an AC by-pass capacitor 32 and the base of transistor 12 is connected, in this example, to a DC blocking capacitor 33. AC signals applied to the blocking capacitor 33 cause a base current to flow through transistor 12 and a collector current to flow through resistor 14. The collector current provides an AC voltage at the collector of transistor 12 and the emitter current provides an AC voltage from the collector of transistor 16 to ground. The AC voltage is selectively coupled to the emitter of transistor 19 and causes a corresponding emitter current to flow. Concurrently, collector current flows through resistor 20 and provides an AC voltage at the collector whose magnitude and phase is dependent upon the characteristics of the filter arrangement between the emitters.

The circuit shown in FIG. 1 has been manufactured using 2N3904 transistors for each of the transistors 12, 16, 19, and 22. Diode 27 was implemented with a 1N194 diode and an inductor of 370 microhenrys was used in parallel with a ceramic filter having part number CSB455. The filter may be purchased from the Murata Corporation of America. Capacitors having a value of 0.01 microfarads were used for each of capacitors 32 and 33. The following table sets forth the values used for the referenced resistors.

| RESISTORS | VALUE |
| --- | --- |
| 14, 20 | 6.2K ohms |
| 15, 21 | 6.2K ohms |
| 17, 23, 28 | 470 ohms |
| 18 | 10K ohms |
| 25 | 4.7K ohms |
| 26 | 2.2K ohms |

Figure 2:
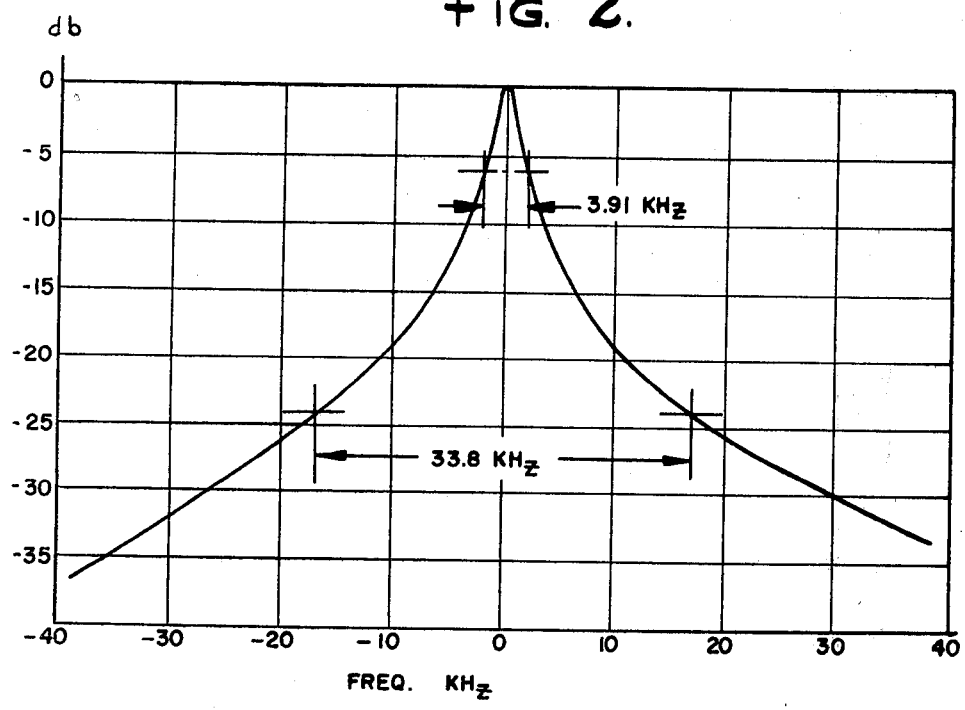
FIG. 2 is a graph which shows the frequency characteristics of the amplifier.

Using a 12 volt power supply and a 0.045 millivolt input signal, output characteristics such as shown in FIG. 2 were measured. The circuit provided a single-ended voltage gain of 34.7 decibels.

Figure 3:
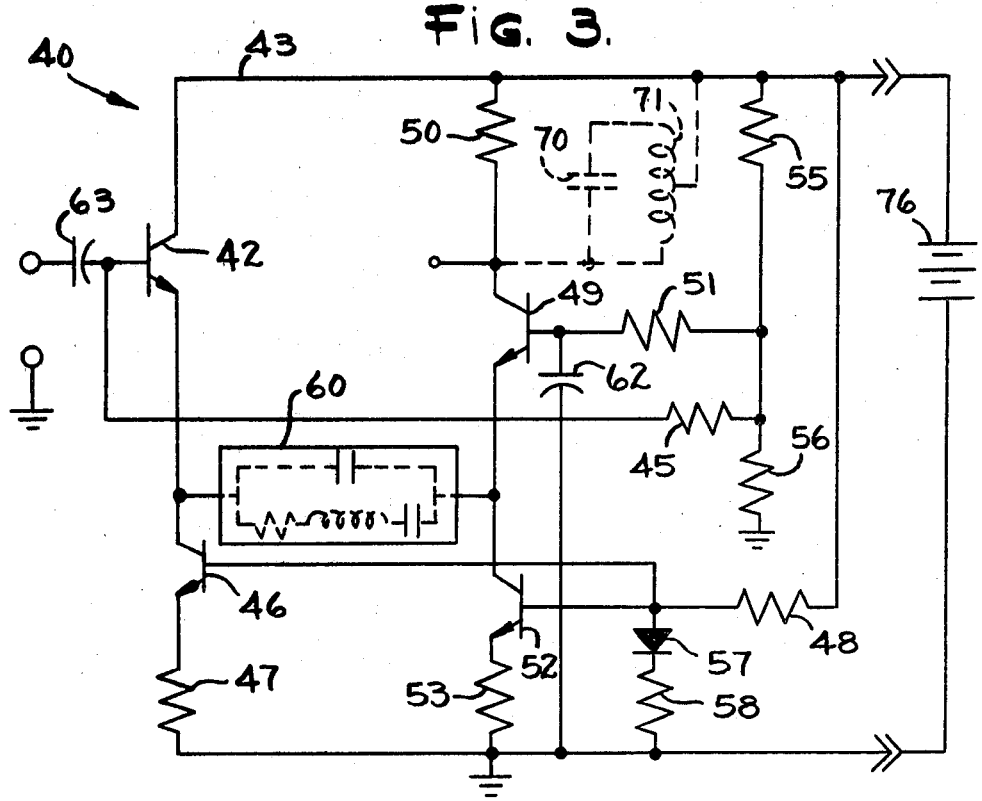
FIG. 3 is a schematic diagram of another bandpass amplifier according to the invention, the amplifier including an unsymmetrical differential amplifier.

Another bandpass amplifier circuit 40, according to the invention is shown in FIG. 3. In this circuit an NPN transistor 42 includes: a collector which is directly coupled to a power line 43, a base which is coupled by a resistor 45 to a voltage divider network, and an emitter which is coupled to a current source circuit. Power line 43 receives a positive voltage from a DC source 76. The current source circuit includes an NPN transistor 46 having a collector which is connected to the emitter of transistor 42, an emitter which is coupled to ground by a resistor 47 and a base which is coupled by a resistor 48 to the power line 43. The potential on line 43 cooperates with the value of resistor 48 to determine the current provided by transistor 46. The circuit also includes an NPN transistor 49 having a collector which is coupled to power line 43 by a resistor 50, a base which is coupled by a resistor 51 to the voltage divider network and an emitter which is coupled to another current source circuit. This current source circuit includes an NPN transistor 52 having a collector which is connected to the emitter of transistor 49, an emitter which is coupled to ground by a resistor 53 and a base which is also coupled by resistor 48 to power line 43. The voltage divider network includes a pair of resistors 55 and 56 which are connected in series between the power lines and ground. The resistors 51 and 45 are each connected to a point between resistors 55 and 56. Resistors 45, 51, 55 and 56 have values which have been selected to bias transistors 42 and 49 in their active regions when a predetermined voltage is present on line 43. In addition to being connected to resistor 48, the bases of transistors 46 and 52 are connected to the anode of a diode 57, the cathode of which is coupled to ground by a resistor 58.

In circuit 40 the emitters of transistors 42 and 49 are coupled by a ceramic filter 60, the base of transistor 49 is coupled to ground by an AC by-pass capacitor 62 and the base of transistor 42 is connected to a DC blocking capacitor 63. FIG. 3 also shows in dotted lines a capacitor 70 and an inductor 71 in parallel and connected to the collector of transistor 49. This combination may be thought of as having been provided by a circuit to be driven by the amplifier. AC signals applied to the blocking capacitor cause a base current to flow through the transistor 42 and a corresponding emitter current. The emitter current provide an AC voltage from the collector of transistor 47 to ground. The AC voltage is selectively coupled to the emitter of transistor 49 and causes a corresponding emitter current to flow. Concurrently, a collector current flows through the impedance provided by resistor 50, capacitor 70 and inductor 71 and provides an AC voltage at the collector whose magnitude and phase is dependent upon the characteristics of the ceramic filter 60 located between the emitters and said impedance.

The circuit shown in FIG. 3 has also been manufactured, using 2N3904 transistors for each of transistors 42, 47, 49 and 52. Diode 57 was implemented with a 1N194 diode and filter 60 was purchased from Murata under part number BFU455. The following table sets forth the values for the referenced resistors

| RESISTORS | VALUE |
| --- | --- |
| 47, 53 | 1K ohms |
| 48 | 6.8K ohms |
| 45, 51 | 12K ohms |
| 50 | 22K ohms |
| 55 | 4.7K ohms |
| 56 | 2.2K ohms |
| 58 | 470 ohms |

Figure 4:
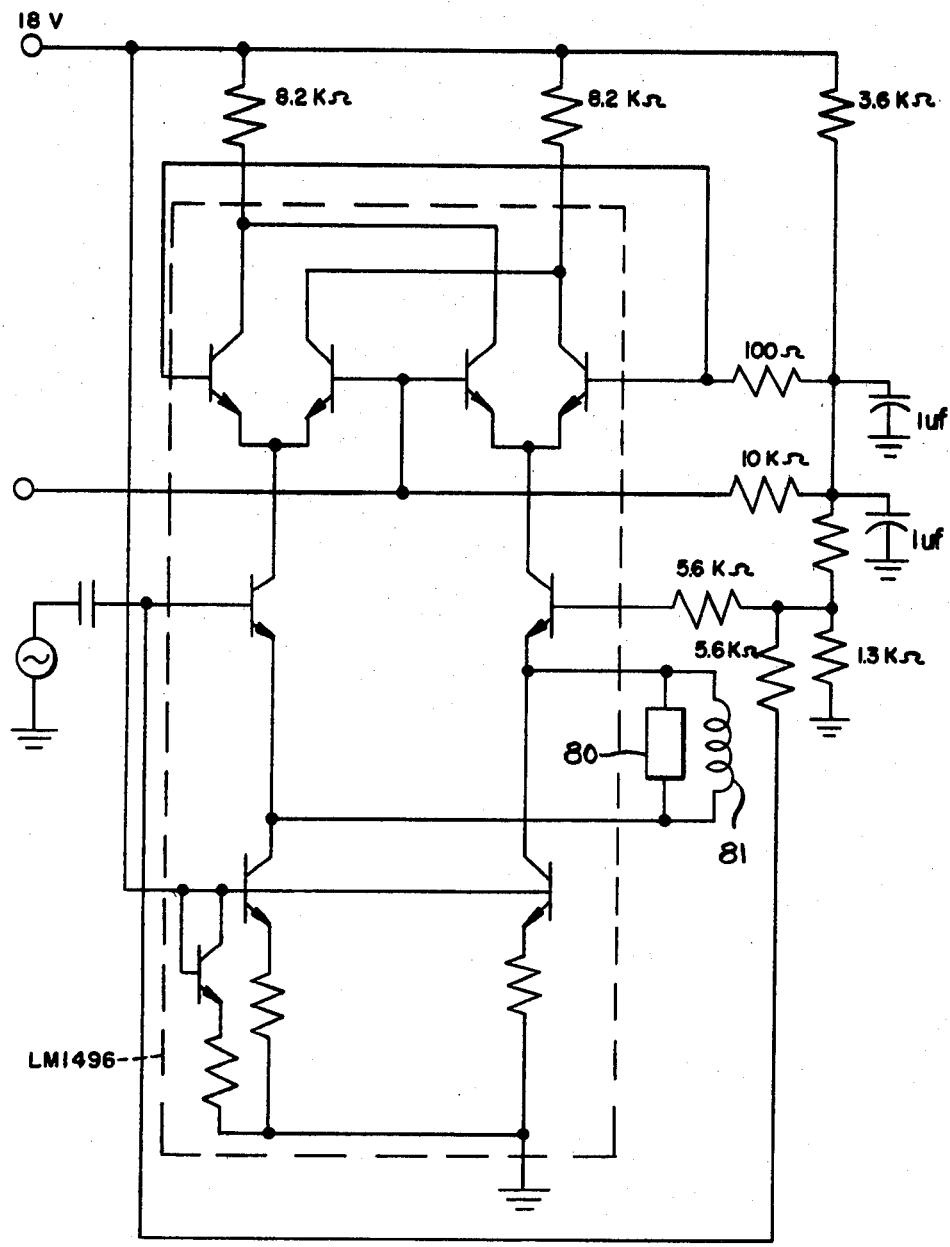
FIG. 4 is a bandpass amplifier, according to the invention, using an integrated balanced modulator circuit.

The circuits shown in FIGS. 1 and 3 demonstrate that amplifiers, according to the invention, may have symmetrical or unsymmetrical loads, either of which may have real or complex values. However, it should also be understood that these loads may be active. An example of a circuit having an active load could include, as shown in FIG. 4, a biased balanced modulator, such as the LM1496, tuned with a CSB455 ceramic filter 80 and an inductor 81.

The circuits described above may be modified by persons skilled in the art to which the invention pertains in ways which are consistent with the spirit of the invention. Therefore, it should be understood that the description herein of preferred embodiments, according to the invention, have been set forth as examples thereof and should not be construed or interpreted to limit the scope of the claims which follow and define the invention.

I claim:

1. A bandpass amplifier circuit of the type which is responsive to a DC power supply, for band limiting and voltage amplifying a signal applied thereto comprising:

(a) a first transistor having a base, a collector, and an emitter the first transistor being connected in base input configuration;
(b) a second transistor having a base, a collector, and an emitter, said base being connected to ground through a capacitor;
(c) means adapted for connection to the power supply for coupling a first voltage to the collector of the first transistor;
(d) impedance means, adapted for coupling to the power supply, coupled to the collector of the second transistor;
(e) means responsive to the power supply and coupled to the bases of the transistors for biasing each of the transistors in their active regions;
(f) a first semiconductor current source circuit connected in series with the emitter of the first transistor;
(g) a second semiconductor current source circuit connected in series with the emitter of the second transistor;
(h) a series resonator coupling the emitters of the first and second transistors.

2. A bandpass circuit as defined in claim 1 wherein said means adapted for connection to the power supply for coupling a first voltage to the collector of the first transistor includes another impedance means coupled to the collector of the first transistor.

3. A bandpass circuit as defined in claim 2 wherein the impedance means coupled to the collector of the second transistor and the impedance means coupled to the collector of the first transistor have values which are substantially real and equal.

4. A bandpass circuit as defined in claim 2 wherein said series resonator is ceramic.

5. A bandpass circuit as defined in claim 4, further including an inductor connected in shunt with the ceramic.

6. A bandpass circuit as defined in claim 1 wherein said series resonator is ceramic.

7. A bandpass circuit as defined in claim 1 wherein said series resonator is a ceramic filter having a nominal center frequency of 455 KHz.

8. The bandpass amplifier circuit of claim 1 wherein the first and second transistors, the first and second current sources, the means for connection to the power supply and said means responsive to said power supply are integrated on a single integrated circuit chip, said chip further including means for connecting the emitters of the first and second transistors to the series resonator.

* * * * *